(12) United States Patent
Pendurkar

(10) Patent No.: US 6,779,141 B1
(45) Date of Patent: Aug. 17, 2004

(54) SYSTEM AND METHOD FOR IMPLEMENTING MEMORY TESTING IN A SRAM UNIT

(75) Inventor: Rajesh Y. Pendurkar, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 444 days.

(21) Appl. No.: 09/590,786

(22) Filed: Jun. 8, 2000

(51) Int. Cl.[7] .......................... G11C 29/00; G11C 7/00
(52) U.S. Cl. ...................................... 714/719; 365/201
(58) Field of Search ............................. 714/718, 719; 365/200, 201

(56) References Cited

U.S. PATENT DOCUMENTS

| | | | | |
|---|---|---|---|---|
| 5,311,476 A | * | 5/1994 | Kajimoto et al. | ............ 365/222 |
| 5,384,784 A | * | 1/1995 | Mori et al. | ................. 714/718 |
| 5,469,443 A | * | 11/1995 | Saxena | ......................... 714/720 |
| 5,506,959 A | * | 4/1996 | Cockburn | ..................... 714/42 |
| 5,513,318 A | * | 4/1996 | van de Goor et al. | ......... 714/48 |
| 5,537,632 A | * | 7/1996 | Gorshe | ......................... 714/42 |
| 5,604,756 A | * | 2/1997 | Kawata | ....................... 371/67.1 |
| 5,734,613 A | * | 3/1998 | Gibson | ................... 365/189.04 |
| 6,046,946 A | * | 4/2000 | Nadeau-Dostie et al. | ... 365/201 |
| 6,070,256 A | * | 5/2000 | Wu et al. | .................... 714/718 |
| 6,216,241 B1 | * | 4/2001 | Fenstermaker et al. | ...... 714/718 |
| 6,550,032 B1 | * | 4/2003 | Zhao et al. | .................. 714/430 |

* cited by examiner

Primary Examiner—Joseph D. Torres
(74) Attorney, Agent, or Firm—Martine & Penilla, LLP

(57) ABSTRACT

The present invention provides a system and method for performing a memory test algorithm with a static random access memory (SRAM) unit having a read control module with no read enable control and write control module with write enable control. The system and method conduct read and write operations to the SRAM unit by avoiding simultaneously reading and writing to the same memory address. Simultaneously reading and writing to the same memory address is avoided by offsetting the read and write signals provided to the SRAM unit.

8 Claims, 6 Drawing Sheets

| Memory address | | Word |
|---|---|---|
| Binary (72) | Decimal (74) | (76) |
| 0000000000 | 0 | 1011010101011100 |
| 0000000001 | 1 | 1010101110001001 |
| 0000000010 | 2 | 0000110101000110 |
| . | . | . |
| . | . | . |
| . | . | . |
| 1111111101 | 1021 | 1001110100010101 |
| 1111111110 | 1022 | 0000110100011110 |
| 1111111111 | 1023 | 1101111000100100 |

Contents of a 1024 x 16 Memory

FIG. 2B

SYSTEM AND METHOD FOR IMPLEMENTING MEMORY TESTING IN A SRAM UNIT

BACKGROUND OF THE INVENTION

1. Field of the Invention

The present invention relates to testing a static random access memory (SRAM) unit. More particularly, the present invention relates to memory testing of an SRAM unit having a write control module with write enable control and a read control module with no read enable control.

2. The Background Art

Memory test algorithms are used to provide highly; efficient testing for static random access memory (SRAM) units. An illustrative example of a variety of memory test algorithms include the 2N, 6N or 12N march test algorithms which are used to test SRAM components. These march test algorithms include testing internal RAM data integrity at the CPU manufacturing and debug stage and for field testing and diagnostic testing.

By way of example and not of limitation, the 6N march test algorithm uses a specific data background and the complement of the specific data background in a read/write manner. The 6N march test consists of six(6) read/write cycles which are accomplished in three passes. Those with ordinary skill in the art shall appreciate that the six read/write operations are identified as:

$\uparrow W_o, \uparrow(R_o\ W_1), \downarrow(R_1\ W_o R_o)$

The first march element ($\uparrow W_o$) writes a particular data background of ones and zeros into the SRAM. The first march element writes addresses from lower to higher memory addresses. The write operation of the first march element is identified as $W_o$. The upward arrow, $\uparrow$, is used to designate performing either read or write operations from lower to higher memory addresses.

The second march element, $\uparrow(R_o\ W_1)$, performs its read and write operations by reading and writing from the lower memory addresses to the higher memory addresses. During the first operation of the second march element, the data background from the first march test is read. This first operation of the second march element is identified as $R_o$. During the second operation of the second march element, the complement of the data background is written to the SRAM addresses. The second operation of the second march element is identified as $W_1$. The complement of the data background is tested to verify that the SRAM cells containing a "one" can store a "zero" and vice versa.

The third march element, $\uparrow(R_1\ W_o\ R_o)$, performs its read and write operation by reading and writing from the higher memory addresses to the lower memory addresses. The downward arrow, $\downarrow$, is used to represent performing read and write operations from higher to lower memory addresses. During the first operation of the third march element, the data background from the write complement, $W_1$, completed in the previous march element is read. This first operation of the third march element is identified as $R_1$. During the second operation of the third march element, the original data background is written back to the same memory locations. This second operation of the third march element is identified as $W_0$. During the third operation of the third march element, the original data background is read from the same memory locations to verify the contents of each location. This third operation is identified as $R_0$.

Referring to FIG. 1, there is shown a block diagram of a prior art testing system 10 having one input data register 12 which is scannable and used for storing data to be written into SRAM 14. The prior art teaches the use of a single input register 12 in conjunction with the memory test algorithm for conducting SRAM diagnostic testing. The initial data background from the single input register is written into each data line of the SRAM 14. The input data register 12 may be comprised of a plurality of flip-flops and/or macros. A macro comprises a plurality of flip-flops. After the initial data background is written into the data line, the $\uparrow W_o$ operation is completed. The complement of the $\uparrow W_o$ operation, i.e. $\uparrow W_1$, is generated by inverting the initial data background (not shown) and scanning in the inverted data background to the single input register. Additionally, it is well known that two input data registers may also be used to write into the datalines of a SRAM.

Complex integrated circuits are tested by generating a comparison between known output patterns and a device under test pattern. The output pattern is generated with input stimuli, and those same input stimuli are presented on the device under test. Comparisons are made cycle by cycle with an option to ignore certain pins, time or patterns. If the device response and the output response are not in agreement, the device is usually considered defective.

Those of ordinary skill in the art shall appreciate that memory testing with a memory test algorithm typically uses a built-in self-test (BIST) logic. BIST logic is built into a circuit to perform testing without the use of an external tester for pattern generation and comparison purposes. The BIST logic provides the ability to categorize failures and separate good from bad units. Additionally, BIST logic supplies clocks to the device and determines the pass/fail from the outputs of the device.

The BIST capability can be implemented on virtually any size CPU block. With BIST a single bit defect can easily be detected using self-testing techniques. Single-point defects in the CPU block from the manufacturing process can show up as a single transistor failure in a RAM or they may be somewhat more complex. If a single-point defect happens to be in the decoder section or in a row or column within the RAM, the device may be nonfunctional.

SUMMARY OF THE INVENTION

The present invention provides a system and method for performing a march test algorithm on an SRAM unit having a write control module with write ports and write enable control, and a read control module with read ports and no read enable control. The system of the present invention includes an address offset unit which communicates with the SRAM unit to avoid reading and writing simultaneously to the same addresses. The SRAM unit includes a plurality of SRAM storage cells, a write control module, a read control module, a write address control, a read address control, and an address decoder.

The address offset unit includes a memory test controller and an address offset module. The memory test controller is configured to communicate a memory test algorithm to the SRAM unit. The address offset module resides within the memory test controller and is configured to send separate signals to the read control module and the write control module to avoid simultaneously reading and writing to the same address. Preferably, the signals generated by the address offset system are communicated to the SRAM unit as part of a programmed march test algorithm which is resident on the CPU as built-in-self-test (BIST) logic.

The present invention also provides an address offset method which performs an illustrative march test algorithm for an SRAM unit having no read enable control. The illustrative march test algorithm is a 6N march test algorithm having a first march, a second march and a third march. The method includes conducting a first march element and a second march element by reading and writing from lower address to higher addresses by incrementing. During the first march element and the second march element, the read operation is offset from the write operation by being one step ahead of the write operation. During the third march element reading and writing is accomplished by reading and writing from the higher addresses to the lower addresses by decrementing. Alternatively, other march test algorithms may be employed.

BRIEF DESCRIPTION OF THE DRAWINGS

FIG. 2b is an illustrative example of a memory address and a memory content.

FIG. 3 is a block diagram of an address offset system coupled to the SRAM unit of FIG. 2a.

DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons having the benefit of this disclosure.

Figure 1:
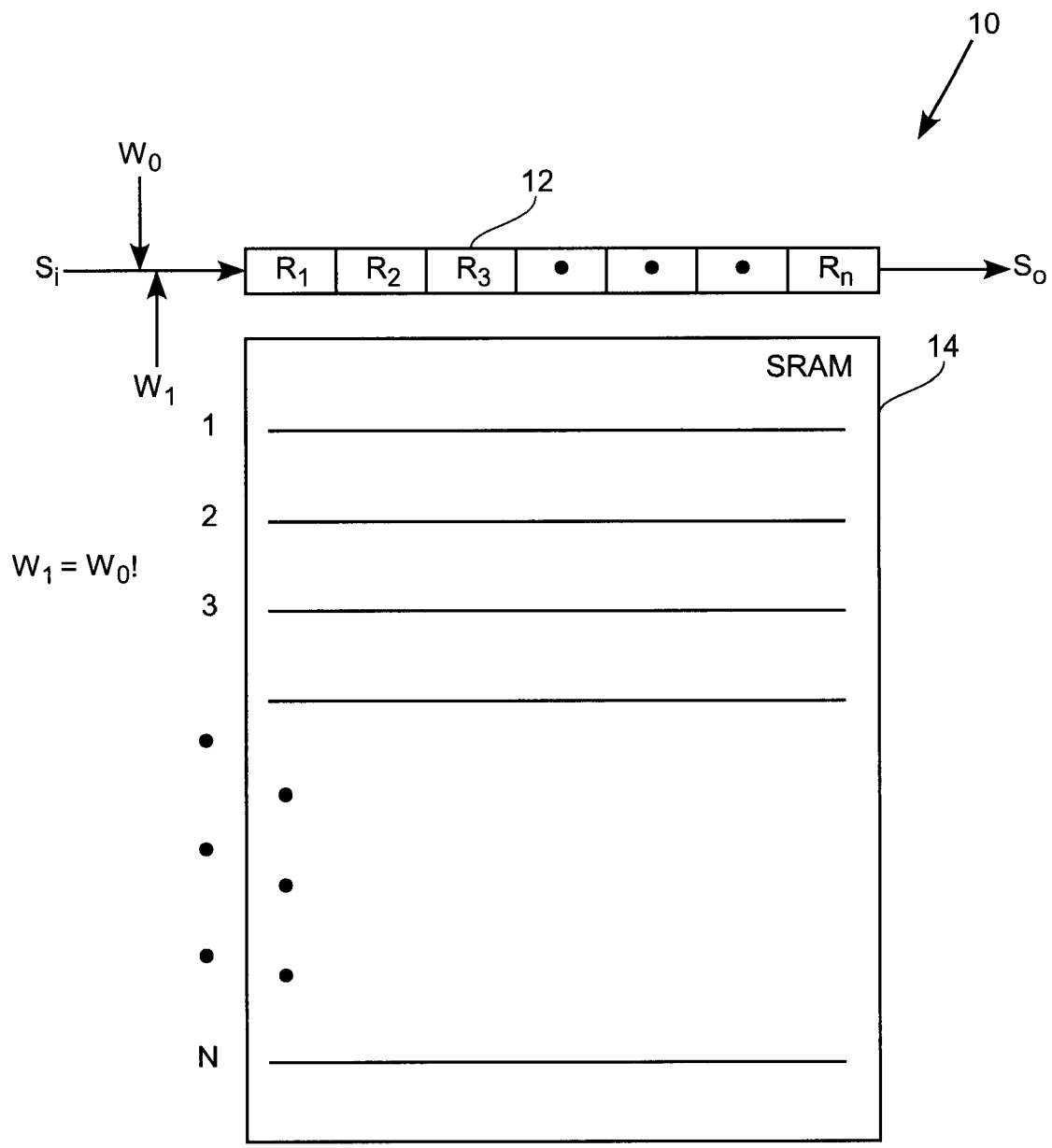
FIG. 1 is a block diagram of a prior art testing apparatus having one input data register which is scanned into SRAM.
Figure 2A:
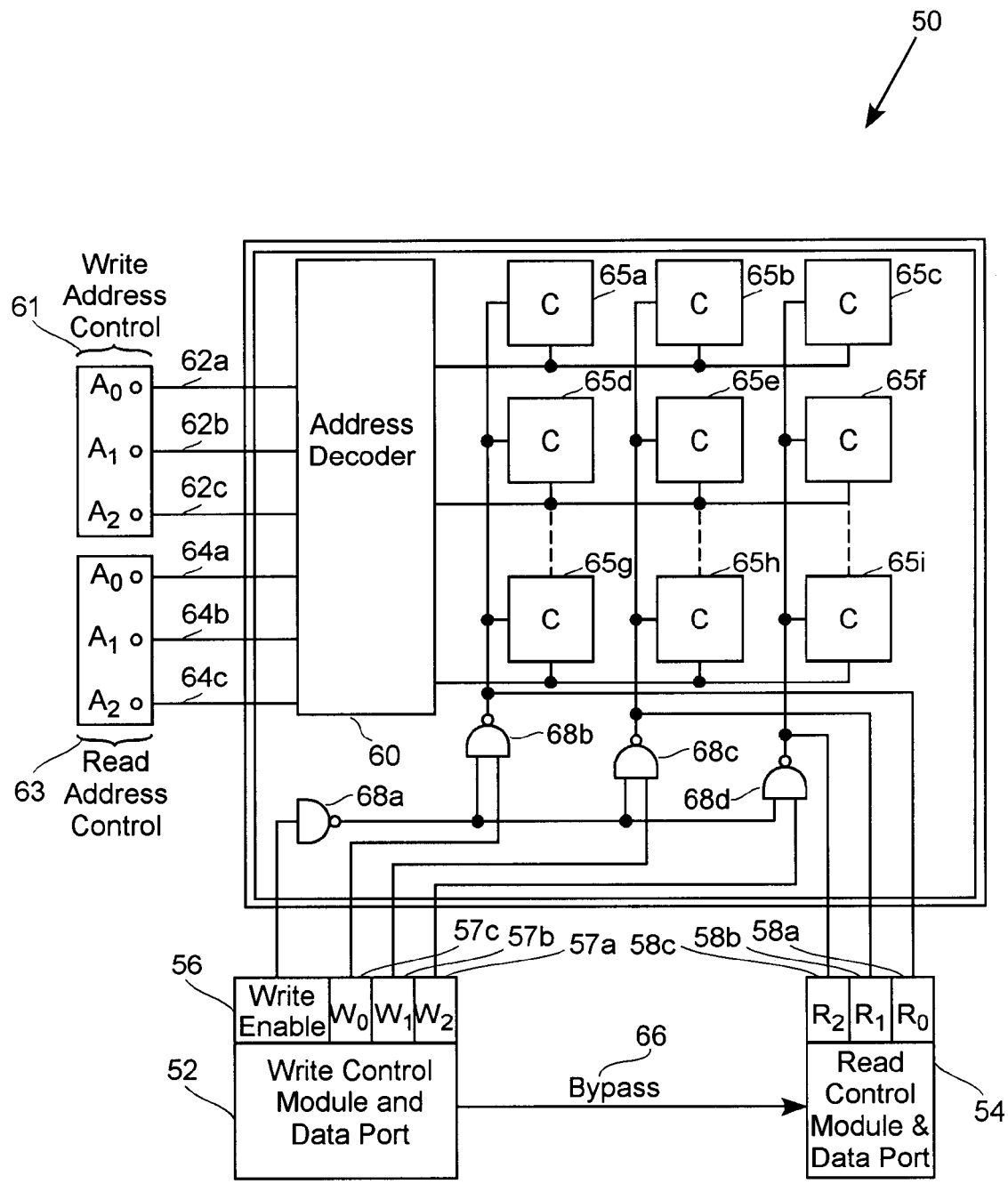
FIG. 2a is a block diagram of an illustrative SRAM unit having a write address control module with a write enable control and a read address control module with no read enable control.

Referring to FIG. 2a, there is shown an illustrative SRAM unit 50 having a write control module 52 and a read control module 54. The write control module 52 includes a write enable control 56 and a plurality of write data ports 57a, 57b and 57c which hold data to be written to the cells or addresses in the SRAM unit 50. The write enable control 56 is in communication with a number of enable gates 68a–68d. Those of ordinary skill in the art shall appreciate that the write enable control 56 is coupled to write data ports 57a, 57b and 57c with logic components. The read control module 54 includes a plurality of read data ports 58a, 58b and 58c which read the cells or addresses in the SRAM unit 50. The SRAM unit 50 also includes an address decoder 60 which receives write address control signals 62a, 62b, and 62c generated by a write address control module 61, and read address control signals 64a, 64,b and 64c generated by a read address control module 63. The read address control signals 64a, 64b, and 64c perform the function of incrementing, decrementing or holding read addresses. The write address control signals 62a, 62b and 62c perform the function of incrementing, decrementing, or holding write addresses. The address decoder 60 communicates these signals to the SRAM cells.

It shall also be appreciated by those of ordinary skill in the art that the illustrative SRAM unit 50 includes a collection of storage cells 65a through 65i together with associated circuits needed to transfer information in and out of the SRAM unit 50. The SRAM unit 50 stores binary information in groups of bits called words. A word in memory is an entity of bits that move in and out of storage as a unit.

It shall also be appreciated by those of ordinary skill in the art that the illustrative SRAM unit 50 is defined by the number of words it contains and the number of bits in each word. The communications between the SRAM unit 50 and its environment is achieved through, inter alia, address lines. The address lines specify the particular word chosen among the many available. Each word in memory is assigned an identification number which is provided by a memory address. The selection of a specific word inside the SRAM unit is accomplished by applying the memory address to the address lines. The address decoder 60 inside the SRAM unit 50 accepts the memory address and opens the paths need to select the word specified. Thus, a particular memory address selects a particular word in the SRAM unit.

Referring to FIG. 2b there is shown an illustrative example of a memory address and of a plurality of words within a SRAM unit 50. The memory addresses include a plurality of 10-bit binary addresses, 72, and a plurality of decimal base memory addresses, 74. The memory content 76 includes a plurality of 16-bit word representations which are associated with a respective memory address.

Referring back to FIG. 2a, the read control module 54 does not include a read enable control for various reasons which include improving SRAM efficiency. As a result of not having a read enable control, it is not possible for the SRAM unit 50 to support reading and writing simultaneously to the same address in a single cycle. In the particular instance where an attempt is made to read and write simultaneously to the same address, a sensor detects the simultaneous read and write operations and a bypass 66 is engaged. When any write operation is generated simultaneously with a read operation at the same memory address, the bypass is engaged and the write operation is submitted to the read control module 54.

Without the ability to perform simultaneous read and write operations to the same address it is not possible to perform SRAM self-testing with classical memory test algorithms. To test SRAMs using a classical memory test algorithm, such as the 6N march test algorithm, a sequence of reads and writes are applied to each cell which is accessed by a unique address. For SRAM 50 having write enable control 56 in write control module 52 and having no read enable control in the read control module 54, reading and writing to the same address simultaneously is prohibited.

The present invention provides a system and method which allows a march test algorithm to be performed when simultaneous read and write operations to the same memory address are prohibited. The system and method of the present invention employs a memory test controller having an address offset module to avoid performing simultaneous read and write operations from the same address. The address offset module is configured to send separate signals to the write address control and the read address control. The signals generated by the address offset module are "offset" to avoid performing simultaneous read and write operations to the same address in the SRAM unit 50. Preferably, the memory test controller having an address offset module, read address control module, and write address control module are incorporated into a built-in self-test (BIST) logic.

Figure 3:
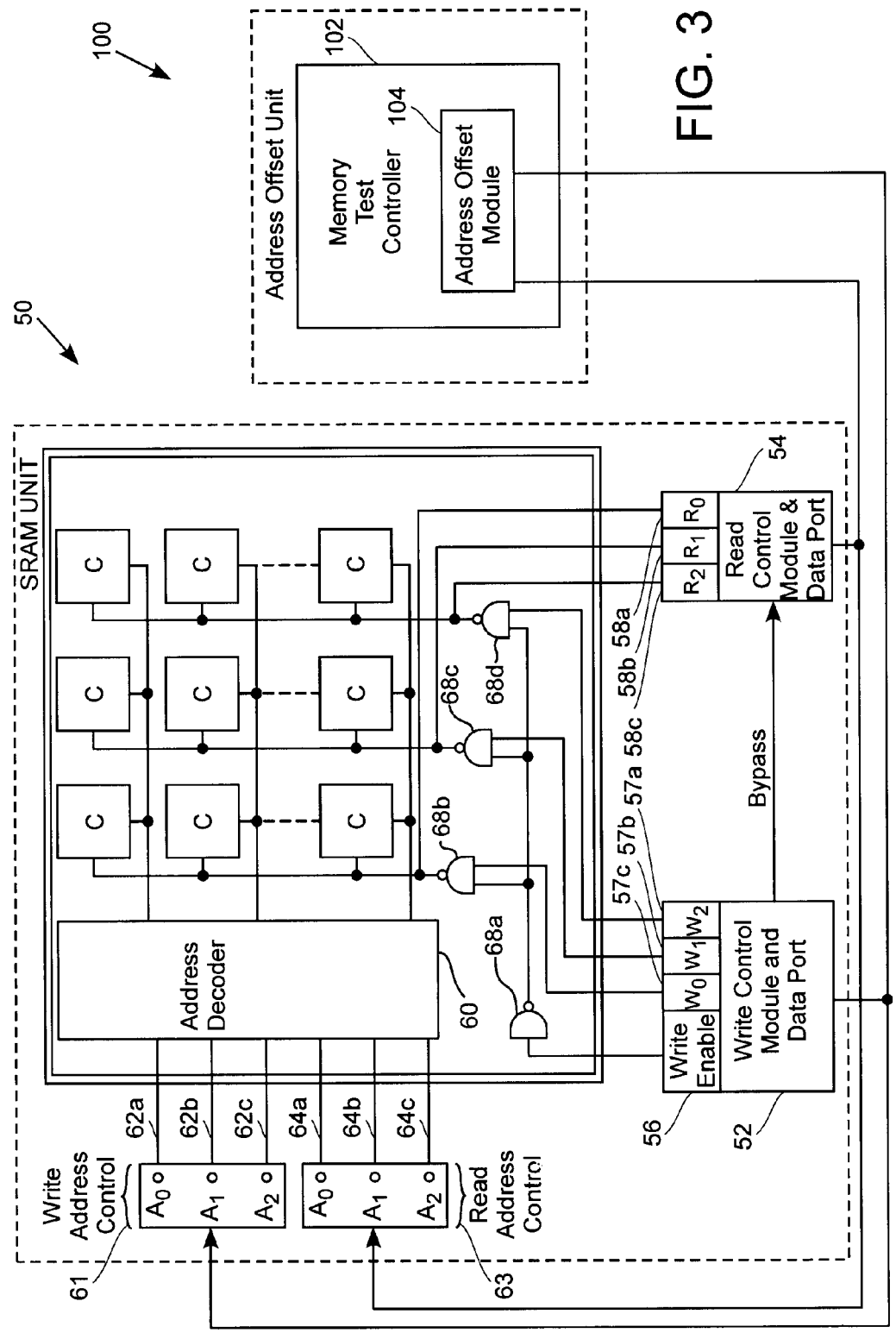

Referring to FIG. 3 there is shown a block diagram of an address offset unit 100 coupled to the SRAM unit 50 of FIG. 2a. The address offset unit 100 permits a march test algorithm to be conducted on SRAM unit 50 having a separate write control module 52 and read control module 54. The address offset unit 100 includes a memory test controller 102 and an address offset module 104 within the memory test controller 104. The memory test controller 102 generates the memory test algorithms for the SRAM unit 50. Additionally, the memory test controller 102 communicates separately with the write control module 52 and read control module 54 via the address offset module 104. Furthermore, the memory test controller 102 communicates the write address control signals 62a, 62b and 62c and the read address control signals 64a, 64b, and 64c.

The memory test controller 102 includes an address offset module 104 which sends write control signals to the write control module 52 and read control signals to the read control module 54 during the performance of a self-test. Additionally, the address offset module 104 communicates offset signals to the write address control module 61 having write address control signal 62a through 62c and to the read address control module 61 having read address control signals 64a through 64c.

When the memory test controller 102 is in a self-test mode performing a march test algorithm, the address offset unit 100 is enabled and the address offset module is engaged. The address offset module 104 increments, decrements or holds the addresses on which a march test algorithm is performed and communicates the incrementing, decrementing and holding to the write address control module .61 and the read address control module 63. The address offset performed by the address offset module 104 is necessary to avoid having the three-bit read data port holding 3-bits of data 58a, 58b and 58c the three-bit write port holding 3-bits of data 57a, 57b and 57c communicate with the same address, i.e. cell. The method for incrementing and decrementing these addresses is described in further detail in the flowchart provided below.

Preferably, the address offset is offset by one address and the one address offset is submitted to the read address control module 63 and the write address control module 61. Also, preferably, the self-test mode employed by the memory test controller operates in a built-in-self-test (BIST) logic. The memory test controller 102 performs the function of guaranteeing that valid self-test control data is being generated and that the self-test data is generated efficiently.

Figure 4:
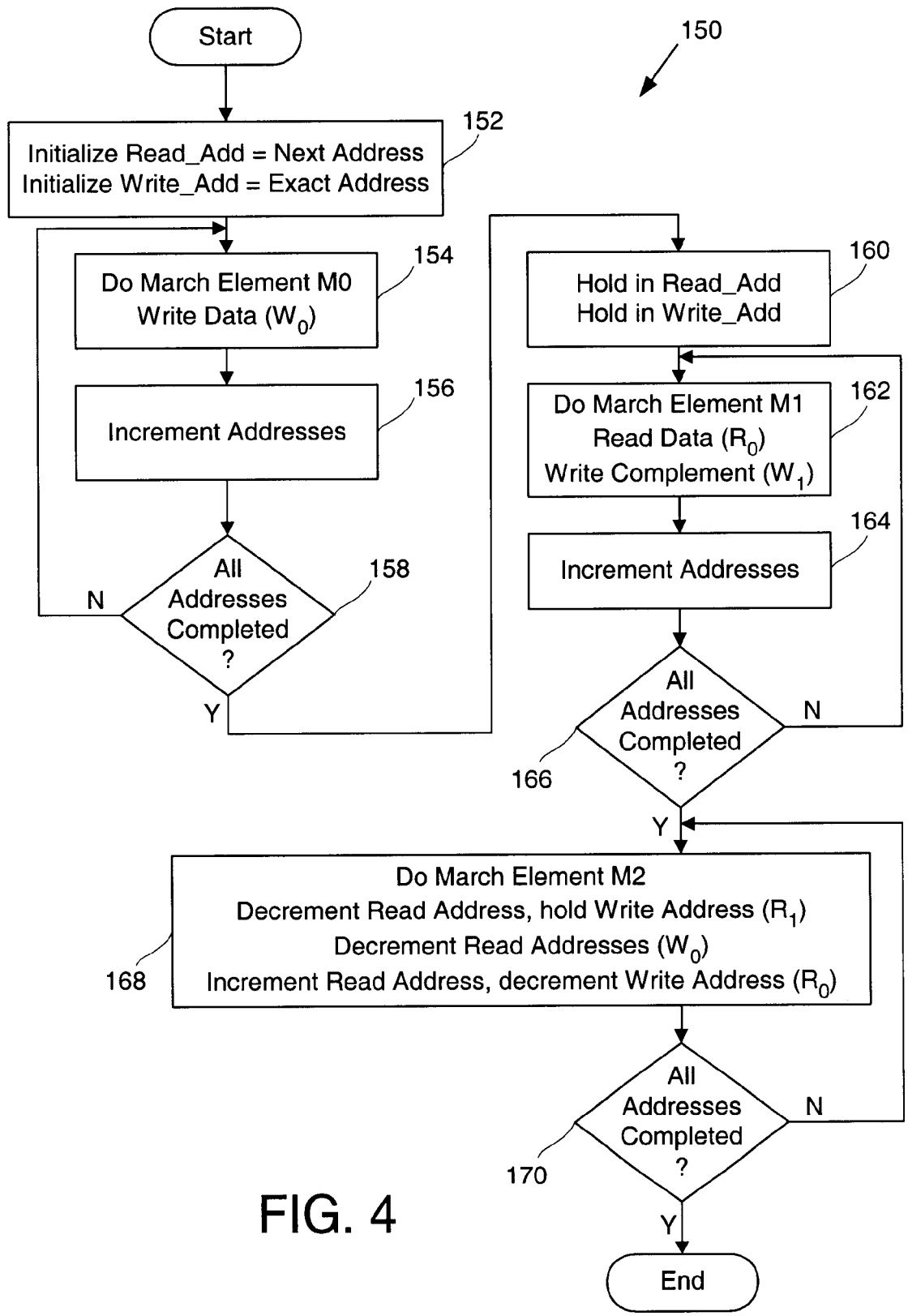
FIG. 4 is a flowchart of an illustrative method to perform a 6N march test algorithm.

Referring to FIG. 4 as well as FIG. 3 there is shown an illustrative method for the address offset unit 100 to perform a 6N march test algorithm. Preferably, the self-test is performed in a BIST environment. By way of example, the illustrative method described below performs the classic 6N march test algorithm on the SRAM unit 50.

At block 152, the method is initialized when the memory test controller 102 is enabled to perform a memory test algorithm such as a march test algorithm. During initialization the read address operation communicated to the read address control module 63 is offset from the write address operation communicated to the write address control module 61 so that the read address operation is effectively "ahead" of the write address operation. As a result, the read address operation and the write address operation do not simultaneously access the same memory address. With respect to time, the read address operation occurs before the write address operation for the same memory address. The method then proceeds to the process 154.

At block 154, the memory test controller 102 begins performing the first march element, identified as M0 in FIG. 4, of the 6N march test algorithm. The first march element writes the data background from lower to higher memory addresses. The write operation is conducted by the write control module 52. As shown in block 154, the write data operation, $W_0$, is performed. The method then proceeds to the process 156.

At block 156, the write operation of block 154 for each address is incremented. As the write address is incremented, the read address is also incremented by the address offset module, so that the read operation remains offset from the write operation. The write address is incremented by the write address control 61 and the read address is incremented by the read address control 63. The read operation and write operation are incremented from lower addresses to higher addresses. The method then proceeds to the process 158.

At diamond 158, it is determined whether the write operation has been completed for all addresses. If the write operation, W0, has not been completed the method returns to block 154 to continue performing the write operation for the first pass of the 6N march test algorithm. If the write operation has been completed for all address, the method then proceeds to block 160.

At block 160, the memory test controller 102 holds the read address and the write address prior to performing the next march test, M1. The method then proceeds to block 162.

At block 162, the memory test controller 102 performs the second march element of the 6N march test algorithm. As described previously, the second march element includes reading the data, $R_0$, and writing the complement of the data, $W_1$, into the addresses. The address offset module 104 offsets the operation of the read address operation from the write address operation, so the read address operation again maintains its position of being one address ahead of the write address operation. The address offset operations are communicated to the write address control 61 and the read address control 63. Therefore during the performance of the first march and the second march, the read address operation is one address ahead of the write address operation. The method then proceeds to block 164.

At block 164, the read operation and write operation of block 162 is incremented for each address. As the read address operation is incremented, the write complement address operation is also incremented by the address offset module. The read address operation and write address operation are incremented from the lower addresses to the higher addresses. The method then proceeds to the process 166.

At diamond 166, it is determined whether the read and write operation of the second march have been completed for all addresses. If the read and write operations have not been completed the method returns to block 162 to continue performing the read and write operations for the second march element of the 6N march test algorithm. If the read and write operations have been completed for all addresses, the method then proceeds to process 168.

At block 168, the memory test controller performs the third march element of the 6N march test algorithm. The third march element includes reading the complement from higher addresses to lower addresses, then writing the data background from the higher addresses to lower addresses, and finally reading the data background from higher addresses to lower addresses. The address offset module ensures that the read operations and the write operations do not simultaneously access the same addresses.

Unlike the first and second march elements in which the read operation and the write operations were performed from the lower addresses to higher address, in the third march element the read operations and write operations are perform by shifting from the higher addresses to the lower addresses. This distinction affects operations of the address offset module 104 so that in the third march element, the read operation is performed one step "ahead" of the write address operation.

During the first portion of the third march, the write complement is read by read operation $R_1$. Since the read operation is performed ahead of the write operation, the write operation is held. The read address operation then proceeds to read addresses from higher addresses to lower addresses by decrementing through the addresses.

During the second portion of the third march, the write operation, $W_o$, is enabled. The write operation writes the original data background into the addresses. The write address operation writes addresses from higher addresses to lower addresses by decrementing through the addresses.

During the third portion of the third march element, the read operation, $R_o$, is then enabled. The read operation performs behind the write address and performs the operation of reading the original data background. The write address operation writes addresses from higher addresses to lower addresses by decrementing through the addresses. The method then proceeds to the process 170.

At diamond 170, it is determined whether the read and write operations of the third march have been completed for all addresses. If the read and write operations have not been completed the method returns to block 168 to continue performing the read and write operations for the third march element of the 6N march test algorithm. If the read and write operations have been completed for all addresses, the self-test is completed.

Figure 5:
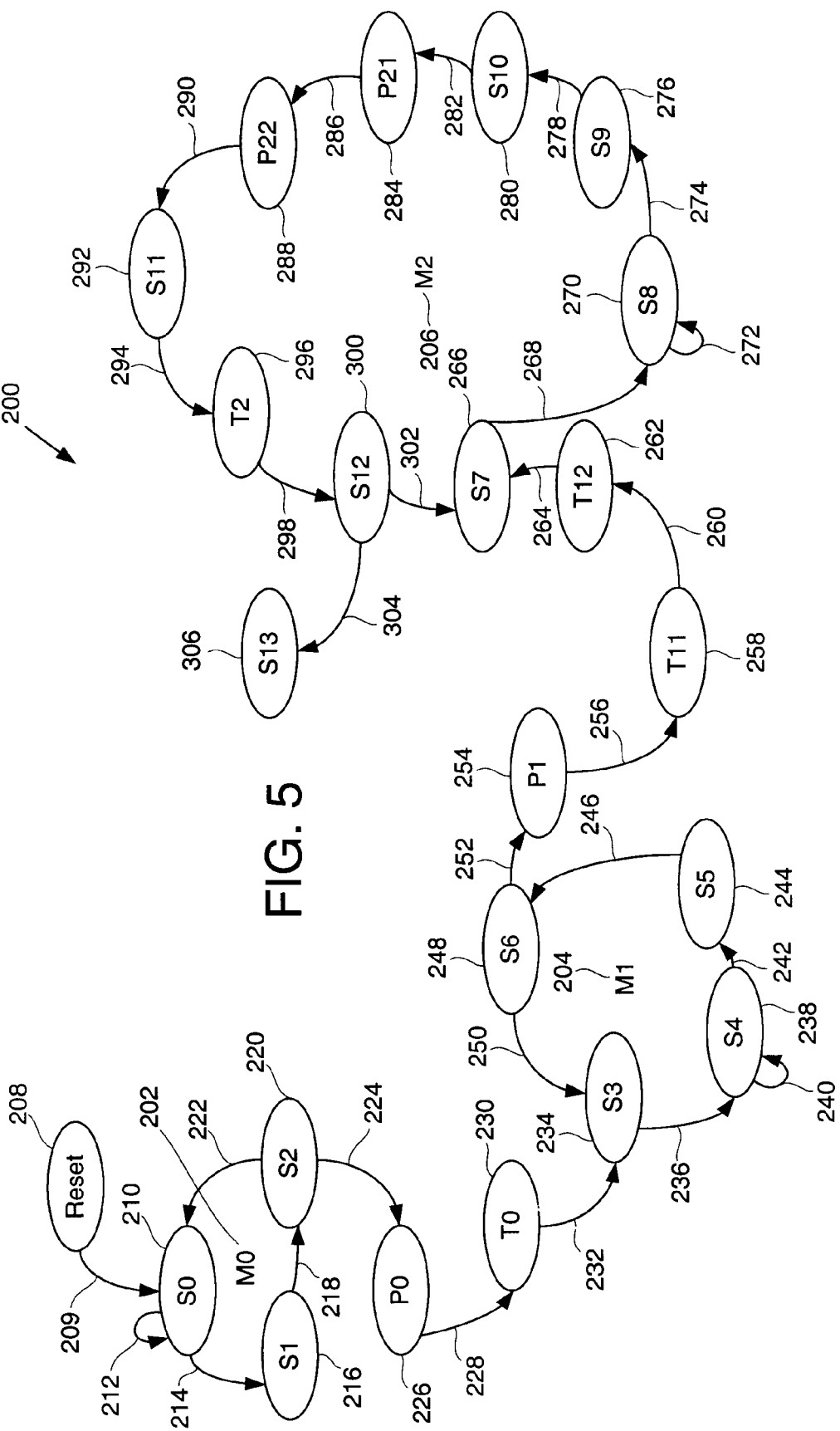
FIG. 5 is an illustrative state diagram for the illustrative method of FIG. 4.

Referring to FIG. 5, there is shown an illustrative state diagram 200, for SRAM unit 50 and address offset unit 100, showing the three march elements associated with the 6N march test algorithm and the various states for completion of the 6N march test algorithm. Additionally, the transition states completed between each of the march elements are shown in FIG. 5. The three march elements are encompassed by the interconnected ovals and include a first march element 202, a second march element 204 and a third march element 206. A standard reset 208 is also used. The states associated with performing each of the march elements is disclosed in further detail below.

An overview of the operations performed by the self-test diagram is provided below. In operation the self-test is engaged at the first march element, M0, identified by reference number 202. The first march element provides for writing a data background from lower to higher addresses. An original data background is written to each of the memory addresses. As the data background is being written, the address offset module ensures that the read address operation is offset from the write operation. After completion of the write operation, the self-test proceeds to an address offset transition described in further detail below.

At the address offset transition, the address offset module checks the state of the read address operation and the write address operation. The address offset module prepares for engaging the second march element. The preparation performed by the address offset module includes offsetting the read address operation so that it is one step ahead of the write address operation, W!. The self-test then proceeds to the second march element 204.

At the second march element 204, the data background is read from lower to higher addresses. Recall that the read address operation is one step ahead of the write address operation. Once the read address operation is completed for each address, the write address operation writes a complement of the data background, W!, to each of the addresses.

The self-test then proceeds to a second address offset transition process which is also described in further detail in the illustrative flow diagram.

At the second address offset, the address offset module checks the state of the read address operation and the write address operation. The address offset module prepares for engaging the third march element. The preparation performed by the address offset module includes offsetting the read address operation so that it is one step behind of the write address operation. The self-test then proceeds to the third march element 206.

At the third march element 206, the memory test controller 102 performs the read operation, writes the data background, and reads the data background. Each of the read and write operations are performed from the higher addresses to the lower addresses. The address offset ensures that the read and write functions do not simultaneously access the same address. As described above, the read function operates "behind" the write operation. The self-test is then completed, or the self-test is reset and the march test algorithm is repeated.

A more detailed discussion of the state diagram is provided here. The state diagram for the self-test is engaged at state Reset, 208. If the state Reset, 208, is engaged, the condition for transition arc 209 is satisfied and the condition necessary for a transition to state 0 is satisfied. At state 0, indicated by oval 210, an input element of the data background for the first march element is generated. The arc 212 describes the condition which requires having generated an input element for the data background before proceeding to the generation of a next input element. Recall, as described above, the first march element provides for writing a data background from lower to higher addresses, $W_o$. If the condition for transition arc 214 is satisfied, the condition for transition arc 214 requires having generated the appropriate data background element. The arc 214 transfers the newly generated data background element to state 1, identified by oval 216. At state 1, 216, a write control assertion is performed which enables the write control module. The condition for transition arc 218 requires having enabled the write control module. If the condition for transition arc 218 is satisfied, the arc 218 transfers the enabled write control module to state 2, identified by oval 220.

At state 2, 220, the writing of a data background element to the appropriate memory address is accomplished. If each memory address on a row has not had a data background element written to it, the condition for transition arc 222 is satisfied. If the condition for transition arc 222 is satisfied, then the data background for the next address is generated at state 210. If all the memory addresses in the row have had a data background element written to it, the condition for transition arc 224 is satisfied. If the condition for transition arc 224 is satisfied, then a transition is made to pause state 0, identified by oval 226.

At pause state 0, 226, the memory test controller pauses the operation to indicate the change from one march element to another march element. The transition arc 228 requires acknowledgement of the change from one march element to another march element before proceeding to the transition state 0 indicated by oval 230. At transition state 0, 230, the change from the first march element to the second march element is acknowledged by the memory test controller. Once the change from the first march element to the second march element is acknowledged, a transition from transition state 0 to state 3, indicated by arc 232, occurs.

At state 3, indicated by oval 234, reading a memory address according to the read state in the second march element is accomplished. The transition arc 236 acknowledges the reading of a memory address before proceeding to state 4, indicated by oval 238. At state 4, 238, an input element of the data background for the second march element is generated. The transition arc 240, which points to the same state from which it originates, describes the condition which requires having generated a complement of the prior input element before proceeding to the generation of the next input element. Recall, as described above, that the second march element provides for writing a complement of the data background from lower to higher addresses, $W_1$. The condition for transition arc 242 requires having an appropriate complement data background element. The arc 242 transfers the newly generated complement of the data background element to state 5, identified by oval 244. At state 5, 244, a write control assertion is performed which enables the write control module. The condition for transition arc 246 requires having enabled the write control module. Once the condition for transition arc 246 is satisfied, the arc 246 transfers the enable write control module to state 6, identified by oval 248.

At state 6, 248 the writing of the data background element to the appropriate memory address is accomplished. If each memory address on a row has not had a data background element written to it, the condition for transition arc 250 is satisfied. If the condition for transition arc 250 is satisfied, then the data background for the next address is generated at state 238. If all the memory addresses in the row have had the complement data background element written to them, the condition for transition arc 252 is satisfied. If the condition for transition arc 252 is satisfied, then a transition is made to pause state 1, identified by oval 254.

At pause state 1, 254, the memory test controller pauses the operation to indicate the change from one march element to another march element. The transition arc 256 requires acknowledgement of the change from one march element to another before proceeding to the first transition state 1 indicated by oval 258. At the first transition state 1, 258, the read address is decremented as part of the address offset operation of the third march element. The transition arc 260 requires acknowledgement that the read address is decremented and then proceeds to a first transition state 2, indicated by oval 262. At first transition state 2, 262, the write memory address operation is held. If the first transition state 2 is completed, the transition arc 264 proceeds to state 7, identified by oval 266.

At state 7, indicated by oval 266, reading a memory address according to the read state in the third march element is accomplished. The transition arc 268 acknowledges the reading of a memory address before proceeding to state 8, indicated by oval 270. At state 8, 270, an input element of the data background for the third march element is generated. The transition arc 272, which points to the same state from which it originates, describes the condition which requires having generated a complement of the prior complement input element before proceeding to the generation of the next input element. Recall, as described above, that the third march element provides for writing the original data background from higher to lower memory addresses, $W_0$. The condition for transition arc 274 requires having appropriate original data background element. The arc transfers the newly generated data background element to state 9, identified by oval 276. At state 9, 276, a write control assertion is performed which enables the write control module. The condition for transition arc 278 requires having enabled the write control module. Once the condition for transition arc 278 is satisfied, the arc 278 transfers the enable write control module to state 10, identified by oval 280.

At state 10, 280, the writing of the data background element to the appropriate memory address is accomplished. The transition arc 282 acknowledges the writing to a memory address before proceeding to a second pause state 1, identified by oval 284. If the condition for transition arc 282 is satisfied, then a transition is made to the second pause state 1, 284. At second pause state 1, 284, the read address is incremented as part of the address offset. If the read address is incremented, the condition for transition arc 286 is satisfied then a change is made to a second pause state 2, identified by oval 288. At second pause state 2, 288, the write address is decremented as part of the address offset. If the write address is incremented, the condition for transition arc 290 is satisfied, then a transition is made to a state 11, identified by oval 292.

At state 11, 292, the read signal is activated for each memory address. If the read signal is activated, a transition by way of transition arc 294 to state transition 2 is completed. At state transition 2, identified by oval 296, the state of each memory address is restored to decrement from the higher to lower memory addresses. Once the state of each memory address is restored to decrement from higher to lower memory addresses, transition arc 298 conditions are satisfied. If the transition arc conditions are satisfied, then a transition is made to state 12, identified by oval 300.

At state 12, 300, the reading of the data background element to the appropriate memory address is accomplished. If each memory address on a row as not had a data background element read, the condition for transition arc 302 is satisfied. If the condition for transition arc 302 is satisfied, then the reading of the complement of the data background generated at state 266 proceeds. If all memory addresses in the row have had a data background element read to it, the condition for transition arc 304 is satisfied. If the condition for transition arc 304 is satisfied, then a transition is made to state 13, identified by oval 306. At state 13, 306, the self-test has ended.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A system for implementing a memory test algorithm, comprising:

a static random access memory (SRAM) unit configured to receive a plurality of memory addresses;

a read control module having at least one read port and no read enable control coupled to enable gates of said SRAM unit, said read control module configured to communicate at least one read address signal to said SRAM unit;

a write control module having at least one write port and write enable control coupled to enable gates of said SRAM unit, said write control module configured to communicate at least one write address signal to said SRAM unit;

a bypass disposed to connect the write control module to the read control module, the bypass configured to prevent a simultaneous communication of the at least one write address signal and the at least one read address signal, wherein the at least one write address signal is equivalent to the at least one read address signal, the bypass enabling the read control module to have no read enable control coupled to enable gates of said SRAM unit;

a read address control module coupled to said SRAM unit, said read address control module configured to increment, decrement, or hold said at least one read address signal;

a write address control module coupled to said SRAM unit, said write address control module configured to increment, decrement, or hold said at least one write address signal; and a memory test controller coupled to said read control module and said write control module, said memory test controller configured to communicate a memory test algorithm and configured to offset said at least one read address signal from said at least one write address signal to be submitted to said read address control module and said write address control module to avoid simultaneously reading and writing to one of said plurality of memory addresses.

2. The system of claim 1 wherein said memory test controller further includes an address offset module configured to offset said at least one read address signal from said at least one write address signal to be submitted to said read address control module and said write address control module.

3. The system of claim 2 wherein said address offset module is configured to offset said at least one read address signal from said at least one write address signal by at least one memory address.

4. The system of claim 1 wherein said memory test controller is configured to perform a march test algorithm.

5. The system of claim 4 wherein said memory test controller is configured to perform a 6N march test algorithm.

6. A method for performing a memory test algorithm with a static random access memory (SRAM) unit configured to receive a plurality of memory addresses, comprising:

providing a read control module with no read enable control coupled to enable gates of said SRAM unit and a write control module with a write enable control coupled to enable gates of said SRAM unit;

providing a memory test controller coupled to said read control module and said write control module, said memory test controller configured to generate a read operation and a write operation;

conducting said read operation and said write operation by generating at least one read address signal and at least one write address signal;

identifying the at least one read address signal as being equivalent to the at least one write address signal, the identifying causing the at least one write address signal to be diverted to the read control module; and offsetting said at least one read address signal from said at least one write address signal to avoid simultaneously reading and writing to one of said plurality of memory addresses.

7. The method of claim 6 further comprising conducting a march test algorithm.

8. The method of claim 7 further comprising conducting a 6N march test algorithm.

* * * * *